United States Patent
Takane et al.

(10) Patent No.: US 7,026,615 B2
(45) Date of Patent: Apr. 11, 2006

(54) SEMICONDUCTOR INSPECTION SYSTEM

(75) Inventors: Atsushi Takane, Mito (JP); Haruo Yoda, Hinode (JP); Shoji Yoshida, Hitachi (JP); Mitsuji Ikeda, Hitachinaka (JP); Yasuhiko Ozawa, Abiko (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/365,383

(22) Filed: Feb. 13, 2003

(65) Prior Publication Data

US 2003/0173516 A1    Sep. 18, 2003

Related U.S. Application Data

(63) Continuation of application No. 10/082,286, filed on Feb. 26, 2002.

(30) Foreign Application Priority Data

Apr. 27, 2001 (JP) .............................. 2001-132668

(51) Int. Cl.
*G21K 7/00* (2006.01)
(52) U.S. Cl. ...................... 250/310; 382/149; 382/151
(58) Field of Classification Search ................. 250/310
See application file for complete search history.

(56) References Cited

U.S. PATENT DOCUMENTS

| | | | | |
|---|---|---|---|---|
| 4,905,151 A | * | 2/1990 | Weiman et al. | 701/28 |
| 5,872,862 A | * | 2/1999 | Okubo et al. | 382/151 |
| 6,539,106 B1 | * | 3/2003 | Gallarda et al. | 382/149 |
| 6,671,405 B1 | * | 12/2003 | Savakis et al. | 382/203 |

FOREIGN PATENT DOCUMENTS

JP    11-038009    8/2000

* cited by examiner

*Primary Examiner*—John R. Lee
*Assistant Examiner*—Phillip A. Johnston
(74) *Attorney, Agent, or Firm*—Dickstein Shapiro Morin & Oshinsky LLP

(57) ABSTRACT

An operator-free and fully automated semiconductor inspection system with high throughput is realized. All conditions required for capturing and inspection are generated from design information such as CAD data. In order to perform actual inspection under the conditions, a semiconductor inspection system is composed of a navigation system for generating all the conditions required for capturing and inspection from the design information and a scanning electron microscope system for actually performing capturing and inspection. Moreover, in the case of performing a matching process between designed data and a SEM image, deformed parts are corrected by use of edge information in accordance with multiple directions and smoothing thereof. Furthermore, a SEM image corresponding to a detected position is re-registered as a template, and the matching process is thereby performed.

7 Claims, 17 Drawing Sheets

Design data(cad data)

Display screen

Bitmap data

Length-measuring point    Template

SEMICONDUCTOR INSPECTION SYSTEM

CROSS REFERENCE TO RELATED APPLICATIONS

The present application is a continuation application of U.S. patent application Ser. No. 10/082,286 filed on Feb. 26, 2002, the disclosure of which is herewith incorporated by reference in its entirety.

BACKGROUND OF THE INVENTION

1. Field of the Invention

The present invention relates to a semiconductor inspection system for analyzing patterns on a semiconductor wafer by use of design data. More specifically, the present invention relates to a semiconductor inspection system provided with a system configuration for automatically generating conditions for capturing and inspection of patterns out of the design data, as well as a method of stably performing a matching process between the design data and scanning electron microscope (SEM) images.

2. Background Art

In recent years, there is a production shift in the semiconductor industry from production of memory chips to production of system large scale integrated circuits (LSIs). From a viewpoint of patterns on a semiconductor wafer, unlike patterns of a memory chip, patterns of a system LSI are not designed as simply repeated patterns. Accordingly, in the case of performing pattern measurement of the system LSI with a length-measuring SEM, which is one of the semiconductor evaluation systems, templates for measuring positions, in other words, templates for matching need to be frequently changed. In actual measurement, frequent capturing operations for registration of the templates may incur a considerable decline in entire throughput. Accordingly, generation of the templates directly from existing design data such as computer aided design (CAD) data has been requested. In the meantime, a wafer size is increased up to 300 mm, whereby the wafer cannot be conveyed by manpower. In addition, inspection in a high-purity clean room is becoming essential. Therefore, complete robotization has been desired in a semiconductor facility. Accordingly, an operator-free and fully-automated semiconductor inspection system is requested, which is not arranged to generate only the templates for measuring positions but is also arranged to generate all conditions required for inspection including capturing conditions, points for length measurement and length-measuring algorithms out of the design data, whereby actual inspection is performed under the foregoing conditions.

In a conventional length-measuring SEM, an image of an actual wafer is captured first and the image is used for registration of the points for image recognition, the positions for length measurement and the length-measuring algorithms. In other words, the actual wafer is required in the first place, and it is also necessary to occupy the length-measuring SEM temporarily to perform capturing of SEM images and registration of various conditions. Moreover, since technologies for matching design data with SEM images have not been developed adequately, accurate matching has been difficult to do. For example, in the case of specifying a pattern position on a SEM image of a semiconductor wafer by applying the design data to a template with the conventional technology, the SEM image is filtered with a Sobel filter or the like to detect edge components for generating an edge image, and then matching such as a normalized correlation process between the edge image and the design data is performed.

FIG. 1 shows a schematic flowchart of conventional processes and FIG. 7 shows some image examples used in the conventional processes. First in Step 101, registration of a template of a desired pattern is performed by use of the design data. The pattern registered from the design data is shown as an image 701. Next, a SEM image is obtained in Step 102. The obtained SEM image is shown as an image 702. In Step 103, the obtained SEM image is subjected to edge emphasis filtering with a Sobel filter or the like. In Step 104, the edge-emphasized image is converted into binary codes for generating a line image in which the edge is only extracted. An image 703 shows the line image extracted out of the SEM image 702. In Step 105, a matching process such as normalized correlation is performed between the line image and the design image registered in Step 101. Then, position detection is performed in Step 106. When detection is performed a plurality of times, Step 102 to 107 will be iterated.

In a conventional semiconductor inspection system, registration of points for image recognition, positions for length measurement and length-measuring algorithms have been performed once after capturing an image of an actual wafer and by use of the image. For this reason, there has been a problem that throughput is not improved because registration is time-consuming and the system is occupied at the time of registration. Moreover, there has been a problem that it is impossible to construct an operator-free and fully automated semiconductor inspection system because the conventional system always requires an operator for judgment and registration by observation of actual SEM images. Furthermore, concerning the technology for matching design information with the SEM images, the conventional technology cannot respond to deformation between the CAD data and the SEM images. The conventional technology also has a problem in the event of extracting edge information out of the SEM image that the edge information cannot be adequately extracted due to a signal/noise ratio (an S/N ratio) of the image. In the event of generating a line image by conversion into binary codes, the conventional technology would be incapable of obtaining an optimum value for a threshold, because determination thereof has been difficult. Accordingly, there has been a problem that a correlation coefficient becomes considerably small in the subsequent matching process by normalized correlation.

SUMMARY OF THE INVENTION

An object of the present invention is to realize an operator-free and fully-automated semiconductor inspection system which generates all necessary conditions, including, conditions for capturing, points for length measurement and length-measuring algorithms, out of design information such as CAD data for performing actual inspection under those conditions. Another object of the present invention is to realize the semiconductor inspection system capable of executing a stable matching process with a high correlation value in the case of performing the matching process between the design data using as a template and SEM images in that system.

In order to achieve the foregoing objects, a first aspect of the present invention is a semiconductor inspection system, which includes: a navigation system for storing design information such as CAD data of a semiconductor chip and for setting capturing and inspecting conditions including a region on a semiconductor wafer subject to inspection based on the design information; and a scanning electron microscope system for performing actual capturing of the semiconductor wafer and for executing inspection in accordance with the capturing and inspecting conditions being set up.

A second aspect of the present invention is the semiconductor inspection system according to the first aspect, in which the navigation system includes a function to design semiconductor patterns by itself or a function to retrieve the design information from another navigation system connected via a network, foregoing another navigation system possessing a designing function.

A third aspect of the present invention is the semiconductor inspection system according to the first aspect, in which the navigation system specifies and retrieves desired design data out of the stored design information to display the design data on a display screen.

A fourth aspect of the present invention is the semiconductor inspection system according to the first aspect, in which the navigation system includes a function to specify and retrieve an arbitrary portion out of the CAD data being the stored design information and to generate bitmap data therefrom.

A fifth aspect of the present invention is the semiconductor inspection system according to the first aspect, in which the navigation system has a function to effectuate automatic editing of all the capturing and inspecting conditions to be used in the scanning electron microscope system out of the design information including the CAD data and to transmit the edited capturing and inspecting conditions to the scanning electron microscope system.

A sixth aspect of the present invention is the semiconductor inspection system according to the first aspect, in which the navigation system has a function to effectuate transmission and receipt of data with another navigation system connected to a network of a facility installed and further to transmit the capturing and inspecting conditions to a plurality of the scanning electron microscope systems connected to the network.

A seventh aspect of the present invention is the semiconductor inspection system according to the first aspect, in which the navigation system includes: a bitmap data generator having a function to generate bitmap data by retrieving desired design data out of the stored design information; and a capturing and inspecting condition editor having a function to edit and transmit the capturing and inspecting conditions to be used in the scanning electron microscope system out of the design data.

An eighth aspect of the present invention is the semiconductor inspection system according to the first aspect, in which the navigation system has a function to automatically detect a characteristic pattern portion and to register the pattern portion as a template, in the case of selecting a template for matching out of bitmap data as one of the inspecting conditions to be used in the scanning electron microscope system.

A ninth aspect of the present invention is the semiconductor inspection system according to the first aspect, in which the scanning electron microscope system uses the capturing and inspecting conditions received from the navigation system, obtains a scanning electron microscope image automatically and performs inspection.

A tenth aspect of the present invention is the semiconductor inspection system according to the first aspect, in which the scanning electron microscope system uses the capturing and inspecting conditions received from another navigation system connected via a network, obtains a scanning electron microscope image automatically and performs inspection.

An eleventh aspect of the present invention is the semiconductor inspection system according to the first aspect, in which the scanning electron microscope system has a function for matching between bitmap data generated from the design information and a scanning electron microscope image.

A twelfth aspect of the present invention is the semiconductor inspection system according to the eleventh aspect, in which the scanning electron microscope system includes: means for generating edge images by retrieving edge information severally from the scanning electron microscope image obtained by capturing and from a template being bitmap data in the case performing a matching process with the scanning electron microscope image obtained by capturing using the bitmap data from the design data as a template; and means for performing the matching process with respect to the edge images severally generated from the scanning electron microscope image and the template while providing the both images with a smoothing process severally so as to make up deformed parts of the both images.

A thirteenth aspect of the present invention is the semiconductor inspection system according to the eleventh aspect, in which the scanning electron microscope system retrieves edge information in accordance with multiple directions and generates edge images depending on the multiple directions in the case of generating edge images by retrieving edge information from a scanning electron microscope image and from a template being bitmap data, and the scanning electron microscope system performs a matching process with respect to each of the images.

A fourteenth aspect of the present invention is the semiconductor inspection system according to the eleventh aspect, in which the scanning electron microscope system performs a matching process by composing edge images generated in accordance with multiple directions and by integrating the edge images into one image, in the case of generating edge images by retrieving edge information from a scanning electron microscope image and from a template being bitmap data.

A fifteenth aspect of the present invention is the semiconductor inspection system according to the first aspect, in which the scanning electron microscope system includes: means for generating an edge image by retrieving edge information from a scanning electron microscope image obtained by capturing in the case of performing a matching process between the scanning electron microscope image and bitmap data from the design information as a template; means for re-registering a portion of the scanning electron microscope image as a template, foregoing portion corresponding to a position of the edge image detected by the matching process between the edge image and design data; and means for using the re-registered template of the scanning electron microscope image in the subsequent matching process.

A sixteenth aspect of the present invention is the semiconductor inspection system according to the fifteenth aspect, in which the scanning electron microscope system carries out re-registration of the template during repeated capturing processes at an interval of an arbitrary period of time or an arbitrary frequency of the processes in the case that the scanning electron microscope system uses the re-registered template of the scanning electron microscope image and performs the matching processes with respect to scanning electron microscope images repeatedly captured.

A seventeenth aspect of the present invention is the semiconductor inspection system according to the fifteenth aspect, in which the scanning electron microscope system compares a correlation value between the design data and the scanning electron microscope image every time and re-registers a new template only when the compared correlation value is higher than the correlation value of the template used at that time.

An eighteenth aspect of the present invention is the semiconductor inspection system according to the fifteenth aspect, in which the scanning electron microscope system performs an arbitrary frequency of the matching processes initially, compares correlation values between the design data and the scanning electron microscope images obtained in the arbitrary frequency of the matching processes, and re-registers the scanning electron microscope image having the highest correlation value as a new template.

A nineteenth aspect of the present invention is the semiconductor inspection system according to the first aspect, in which the capturing and inspecting conditions are selected from a capturing and inspecting condition file registered in advance with any one of the navigation system and the scanning electron microscope system.

A twentieth aspect of the present invention is the semiconductor inspection system according to the nineteenth aspect, in which the capturing and inspecting conditions are selected from the capturing and inspecting condition file weighted in accordance with a frequency of use in the past.

A twenty-first aspect of the present invention is the semiconductor inspection system according to the nineteenth aspect, in which a capturing and inspecting condition inside the capturing and inspecting condition file is automatically deleted from the capturing and deleting condition file when a frequency of use of the capturing and inspecting condition is lower than a predetermined frequency.

A twenty-second aspect of the present invention is the semiconductor inspection system according to the nineteenth aspect, which further includes a function to modify and to edit a part of the capturing and inspecting conditions inside the capturing and inspecting condition file, the capturing and inspecting condition file being registered in advance.

A twenty-third aspect of the present invention is the semiconductor inspection system according to the nineteenth aspect, which further includes a function to register a condition with the capturing and inspecting condition file as another condition, when a part of the capturing and inspecting conditions inside the capturing and inspecting condition file being registered in advance is modified.

The semiconductor inspection system according to the first aspect is composed of the navigation system for storing the design data of a semiconductor chip and the scanning electron microscope system for executing actual capturing and inspection of a semiconductor wafer by use of the information. Therefore, it is possible to construct a system which generates the capturing and inspecting conditions using the design data of a semiconductor chip and actually executes capturing and inspection.

In the semiconductor inspection system according to the second aspect, the navigation system includes the function to design semiconductor patterns by itself or the function to retrieve and store the design information from another navigation system connected via a network which possesses a designing function. Therefore, the capturing and inspecting conditions can be readily set up based on the design information.

In the semiconductor inspection system according to the third aspect, the navigation system is provided with a function to specify and retrieve desired design data out of the design information storing various information such as layers and cells required for pattern designing and to display the design data on a display screen. Therefore, an operator can readily set up the capturing and inspecting conditions based on the design data on the display screen.

In the semiconductor inspection system according to the fourth aspect, the navigation system is provided with the function to retrieve an arbitrarily specified portion out of the CAD data being the design information in order to generate bitmap data. Therefore, the bitmap data can be used for matching by the scanning electron microscope system.

In the semiconductor inspection system according to the fifth aspect, the navigation system is provided with the function to effectuate automatic editing of all the capturing and inspecting conditions to be used in the scanning electron microscope system out of the design information including the CAD data and to transmit the edited capturing and inspecting conditions to the scanning electron microscope system. Therefore, the scanning electron microscope system can execute capturing and inspection by use of the automatically extracted conditions, whereby full-automation of the system becomes feasible.

In the semiconductor inspection system according to the sixth aspect, the navigation system is provided with the function to effectuate transmission and receipt of data with another navigation system connected to a network of a facility installed and further to transmit the capturing and inspecting conditions to a plurality of the scanning electron microscope systems connected to the network. Therefore, a plurality of navigation systems and a plurality of the scanning electron microscope systems can collaborate to execute efficient capturing and inspection.

In the semiconductor inspection system according to the seventh aspect, the navigation system includes a portion having the function to generate bitmap data by retrieving desired design data out of the stored design information, and a portion having the function to edit and transmit the capturing and inspecting conditions to be used in the scanning electron microscope system out of the design data. Therefore, the capturing and inspecting conditions can be edited by use of the bitmap data. Moreover, the navigation system can be also composed of a plurality of systems by use of the network.

In the semiconductor inspection system according to the eighth aspect, the navigation system is provided with the function to automatically detect a characteristic pattern portion and to register the pattern portion as a template, in the case of selecting a template for matching out of bitmap data as one inspecting condition to be used in the scanning electron microscope system. Therefore, the template registration does not require manpower.

In the semiconductor inspection system according to the ninth aspect, the scanning electron microscope system is provided with the function to use the capturing and inspecting conditions received from the navigation system, to obtain a scanning electron microscope image automatically and to perform inspection. Therefore, the system does not require control by an operator and capturing and inspection can be thereby automated.

In the semiconductor inspection system according to the tenth aspect, the scanning electron microscope system is provided with the function to use the capturing and inspecting conditions received from another navigation system connected via a network, to obtain a scanning electron microscope image automatically and to perform inspection. Therefore, a plurality of scanning electron microscope systems can be automatically operated without controlling by an operator.

In the semiconductor inspection system according to the eleventh aspect, the scanning electron microscope system is provided with the function for matching between bitmap data generated from the design information and a scanning electron microscope image. Therefore, the scanning electron microscope system can perform highly accurate and efficient inspection by use of the design information.

In the semiconductor inspection system according to the twelfth aspect, the scanning electron microscope system is provided with a function to generate edge images by retrieving edge information severally from the scanning electron microscope image obtained by capturing and from a template being bitmap data in the case of performing a matching process between the scanning electron microscope image and the bitmap data out of the design data while providing a smoothing process severally so as to make up deformed parts thereof. Therefore, matching can be performed with a high detection ratio.

In the semiconductor inspection system according to the thirteenth aspect, the scanning electron microscope system is provided with a function to retrieve edge information in accordance with multiple directions and to generate edge images depending on the multiple directions in the case of generating edge images by retrieving edge information from a scanning electron microscope image and from the bitmap data, a function to perform a matching process with respect to each of the images. Therefore, matching can be performed with good positional accuracy.

In the semiconductor inspection system according to the fourteenth aspect, the scanning electron microscope system is provided with a function to perform a matching process by composing edge images generated in accordance with multiple directions and by integrating the edge images into one image in the case of generating edge images by retrieving edge information from a scanning electron microscope image and from bitmap data. Therefore, matching can be performed with fine positional accuracy and in a high speed.

The semiconductor inspection system according to the fifteenth aspect uses the re-registered template of the SEM image and effectuates a matching process between graded SEM images. Therefore, matching can be performed with a high correlation value and with a stable detection ratio.

In the semiconductor inspection system according to the sixteenth aspect, re-registration of the template as described in the fifteenth aspect is carried out during repeated capturing at an interval of either an arbitrary period of time or an arbitrary frequency of the processes. Therefore, the matching process with a high correlation value and with a stable detection ratio can be performed in response to changes of SEM images with passage of time in the course of capturing.

In the semiconductor inspection system according to the seventeenth aspect, a correlation value between the design data and a SEM image is compared in the case of registering a new template, and the template is re-registered only when the correlation value is higher than before. Therefore, the template can be optimized along with a higher correlation value.

In the semiconductor inspection system according to the eighteenth aspect, the matching processes between the design data and the edge images as described in the fifteenth aspect are performed initially in an arbitrary frequency. Thereafter, correlation values then are compared and the edge image having the highest correlation value of all the edge images is re-registered as the template. Accordingly, it is possible to select a template of a SEM image having a higher correlation value.

In the semiconductor inspection system according to the nineteenth aspect, either the navigation system or the scanning electron microscope system is provided with a function to select the capturing and inspecting conditions from a previously registered file. Therefore, the conditions can be efficiently decided.

In the semiconductor inspection system according to the twentieth aspect, in the case of selecting from the capturing and inspecting condition file, the capturing and inspecting conditions are weighted depending on a frequency of use in the past and the conditions are selected therefrom. Therefore, the conditions can be efficiently decided.

In the semiconductor inspection system according to the twenty-first aspect, a capturing and inspecting condition inside the capturing and inspecting condition file is deleted automatically from the capturing and inspecting condition file in the case that a frequency of use thereof is lower than a predetermined frequency. Therefore, the conditions can be efficiently decided.

In the semiconductor inspection system according to the twenty-second aspect, the semiconductor inspection system of the nineteenth aspect is provided with a function to modify and edit a part of the capturing and inspecting conditions inside the capturing and inspecting condition file registered in advance. Therefore, the conditions can be efficiently decided with reference to the precedent conditions.

In the semiconductor inspection system according to the twenty-third aspect, in the case that a part of the capturing and inspecting conditions inside the capturing and inspecting condition file being registered in advance is modified and edited, the semiconductor inspection system of the nineteenth aspect is provided with a function to register the relevant condition with the capturing and inspecting condition file as another condition. Therefore the conditions can be efficiently decided thereafter.

DETAILED DESCRIPTION OF THE PREFERRED EMBODIMENT

Figure 3:
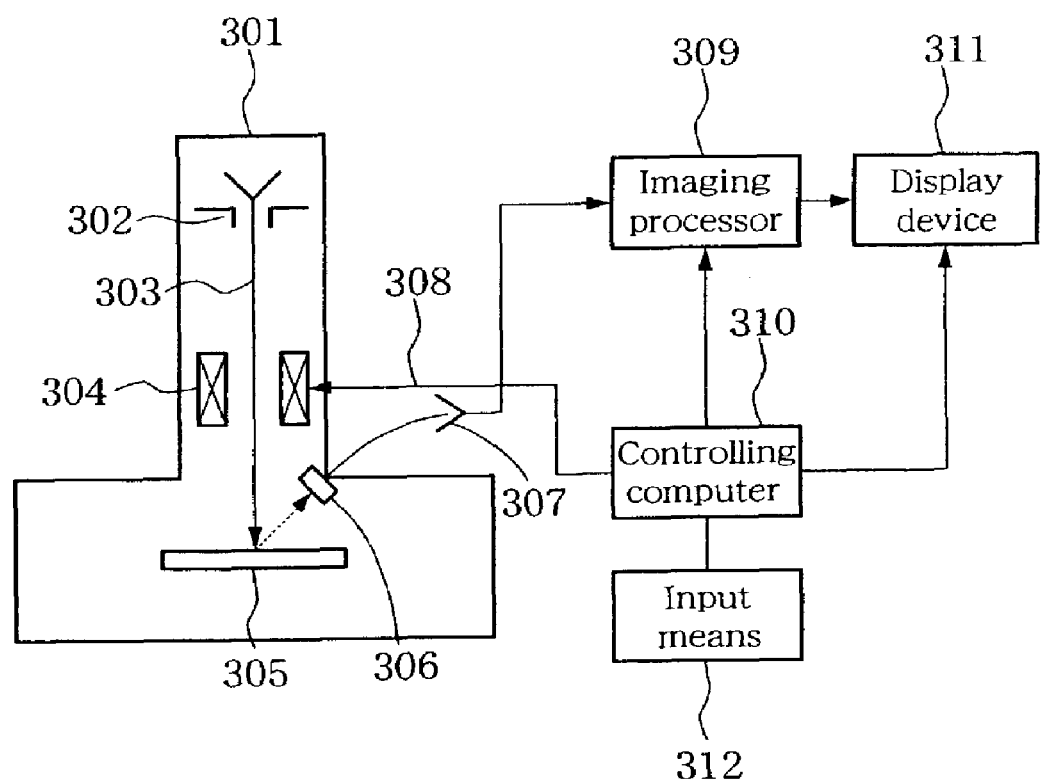
FIG. 3 is a schematic diagram of a configuration of a semiconductor inspection system according to the embodiment of the present invention.

FIG. 3 is a block diagram of a schematic configuration of a scanning electron microscope system of the present invention. Reference numeral 301 denotes a body of an electron microscope. An electron beam 303 emitted out of an electron gun 302 is converged by an unillustrated electron lens and irradiated on a sample 305. Either intensity of secondary electrons generated from a surface of the sample or intensity of reflected electrons by electron beam irradiation is detected by an electron detector 306 and amplified by an amplifier 307. Reference numeral 304 denotes a deflector 304 which deflects the electron beam, thus subjecting the electron beam 303 to raster scanning on the sample surface according to a control signal 308 of a controlling computer 310. A signal outputted from the amplifier 307 is converted from analog to digital inside an imaging processor 309, whereby digital image data are generated. Reference numeral 311 denotes a display device for displaying the image data. Moreover, the imaging processor 309 includes an image memory for storing the digital image data, an imaging circuit for performing various imaging processes and a display control circuit for performing display control. Input means 312 such as a keyboard and a mouse is connected with the controlling computer 310.

During fabrication of a semiconductor device, the electron microscope system is used upon measurement of line widths of fine patterns drawn on a wafer. In this event, the normalized correlation method is currently used as a method to find out a portion on the wafer to measure the line width. In such a case, selection of an optimum template is deemed essential. The imaging processor 309 of the present invention has a constitution which effectuates optimum template selection upon template matching, whereby the imaging processor 309 is adoptable to the electron microscope system.

Figure 1:
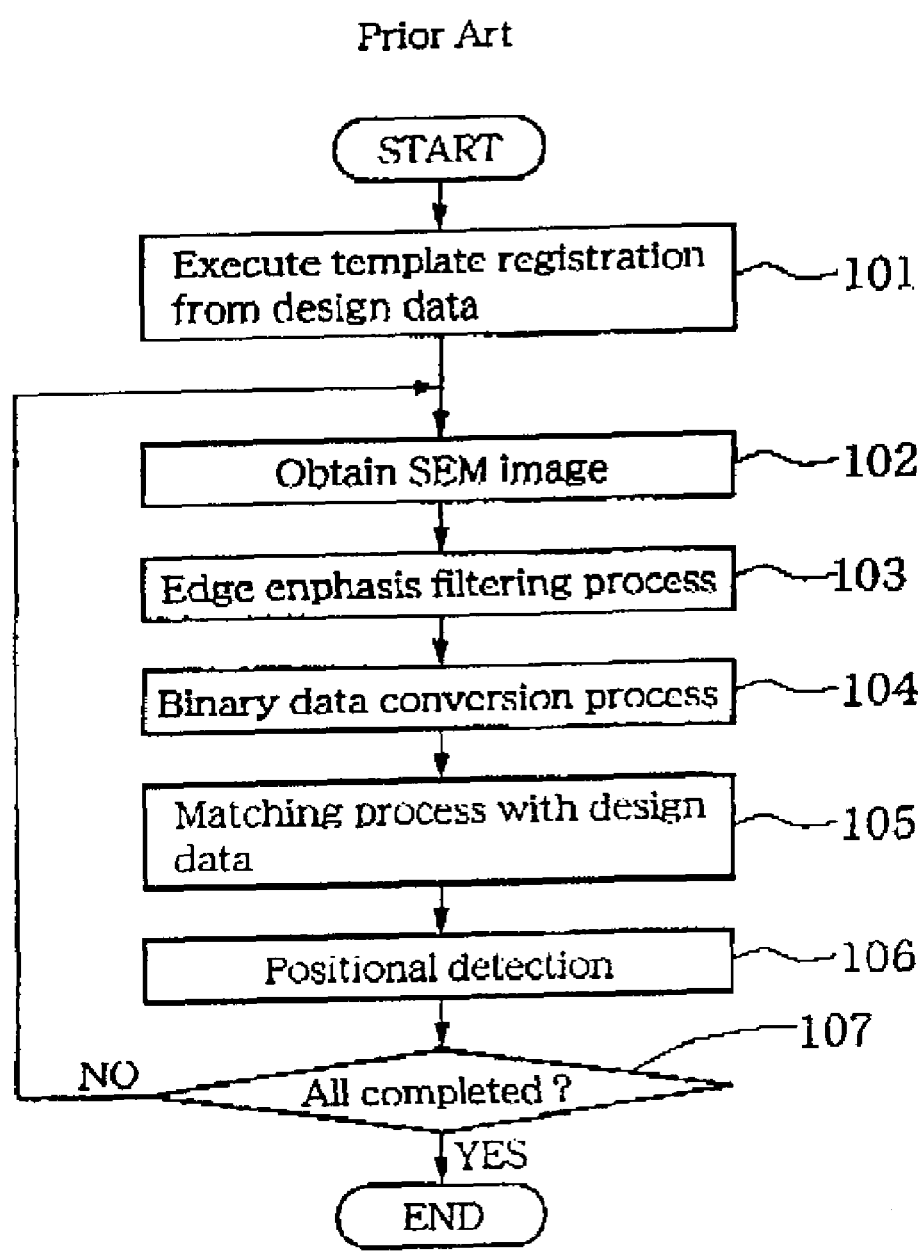
FIG. 1 is a flowchart of a conventional matching process between design data and a SEM image.
Figure 2:
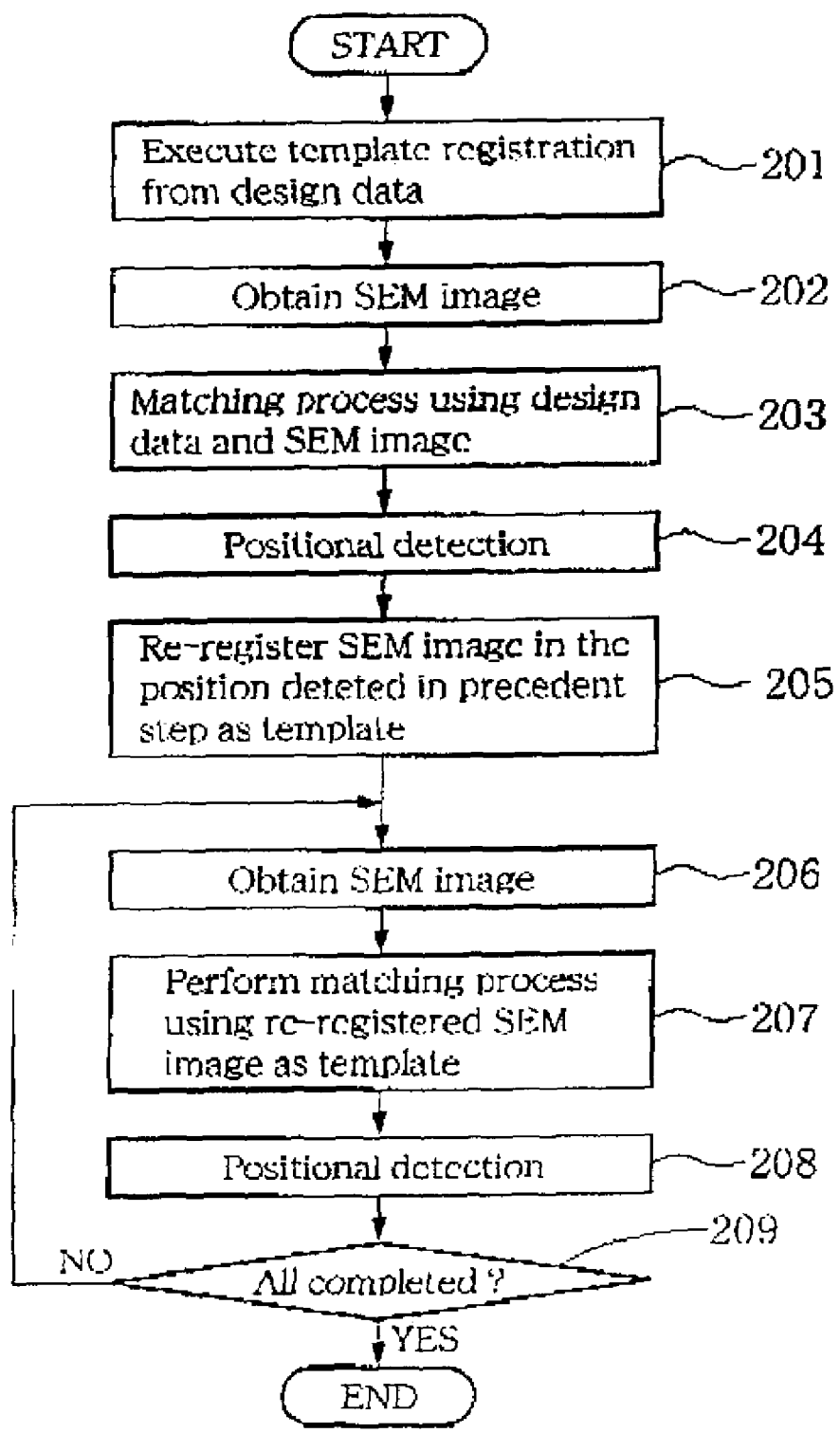
FIG. 2 is a flowchart of a matching process by use of design data and a SEM image according to one embodiment of the present invention.

FIG. 2 is a flowchart of a matching process according to one embodiment of the present invention using design data and a SEM image. First in Step 201, a pattern portion requested for detection is registered out of the design data as a template. The SEM image is obtained in Step 202, and the matching process is performed in Step 203. Although there are various ways concerning this matching process, a way similar to Steps 103 to 105 of FIG. 1 (the edge emphasis filtering process, the binary conversion process and the normalized correlation process) may be used, for example. As a result, a position on the SEM image corresponding to the pattern of the designed data is detected in Step 204. Next in Step 205, the portion of the SEM image detected in Step 204 as corresponding to the pattern of the design data is re-registered as a template. Thereafter, another SEM image is obtained in Step 206. Then in Step 207, a matching process is performed while using the SEM image re-registered in Step 205 as the template, and position detection is performed in Step 208. In the foregoing steps, since the re-registered template is a SEM image, the matching process takes place between two graded SEM images. Accordingly, it is possible to perform the matching process with a high correlation value and a stable detection ratio as well. When detection is performed a plurality of times, Steps 206 to 209 will be iterated. If the template for initial registration is preset, then the subsequent processes can be conducted automatically by a computer program.

Figure 4:
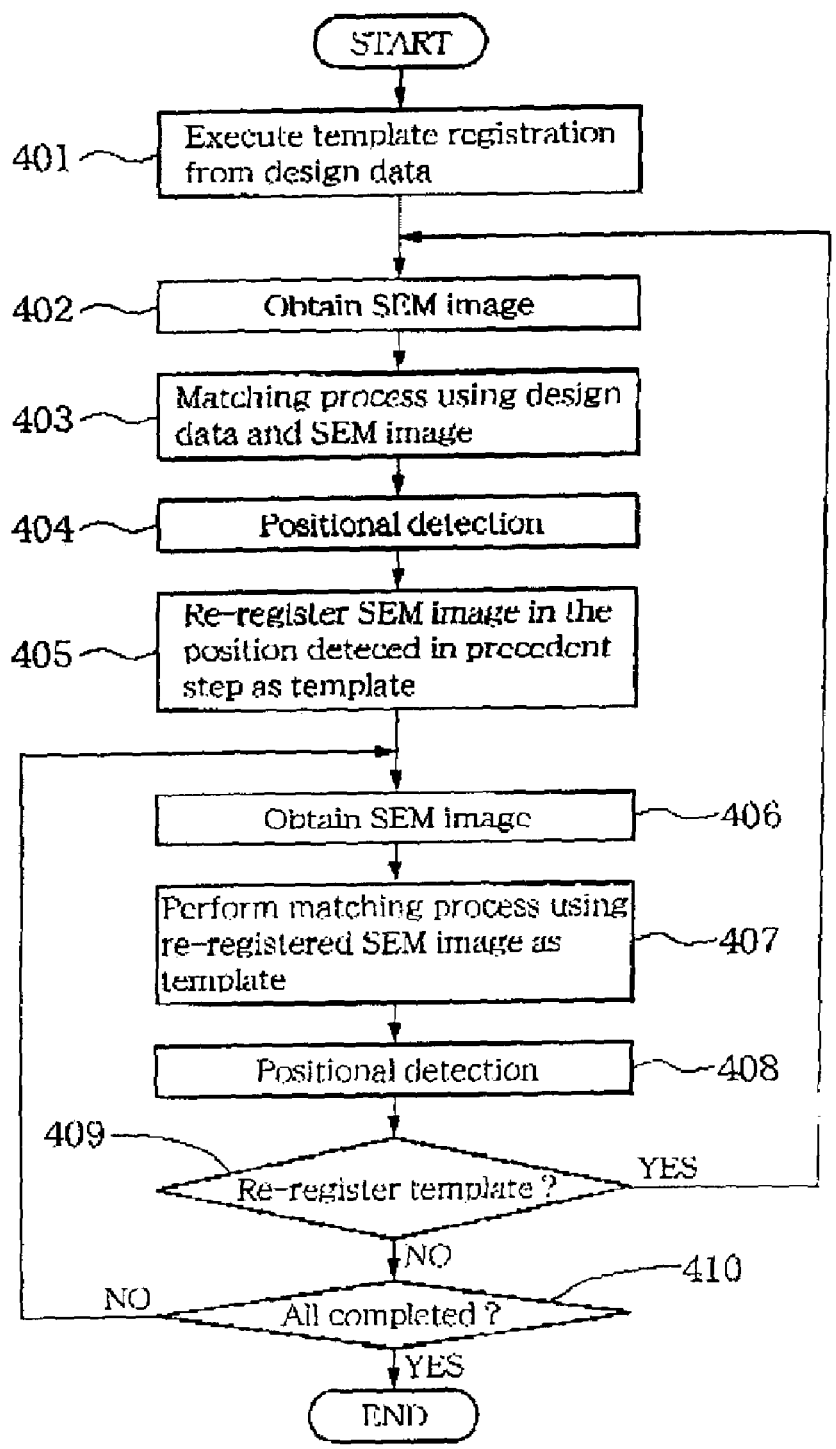
FIG. 4 is a flowchart for a case of time-lapse re-registration of a SEM image as a template according to the embodiment of the present invention.

FIG. 4 is a flowchart of a case of time-lapse re-registration of the SEM image as the template according to the embodiment of the present invention. Steps 401 to 408 correspond to Steps 201 to 208 of FIG. 2, respectively. In Step 409, judgment is made as to whether or not re-registration of the template is carried out in every certain time interval or in every certain process frequency. When re-registration is carried out, Steps 402 to 405 are executed for performing the matching process again by use of the design data and the SEM image. In this way, it is possible to perform the matching process with a high correlation value and a high detection ratio even if the SEM image is changed with passage of time in the course of image capturing.

Figure 5:
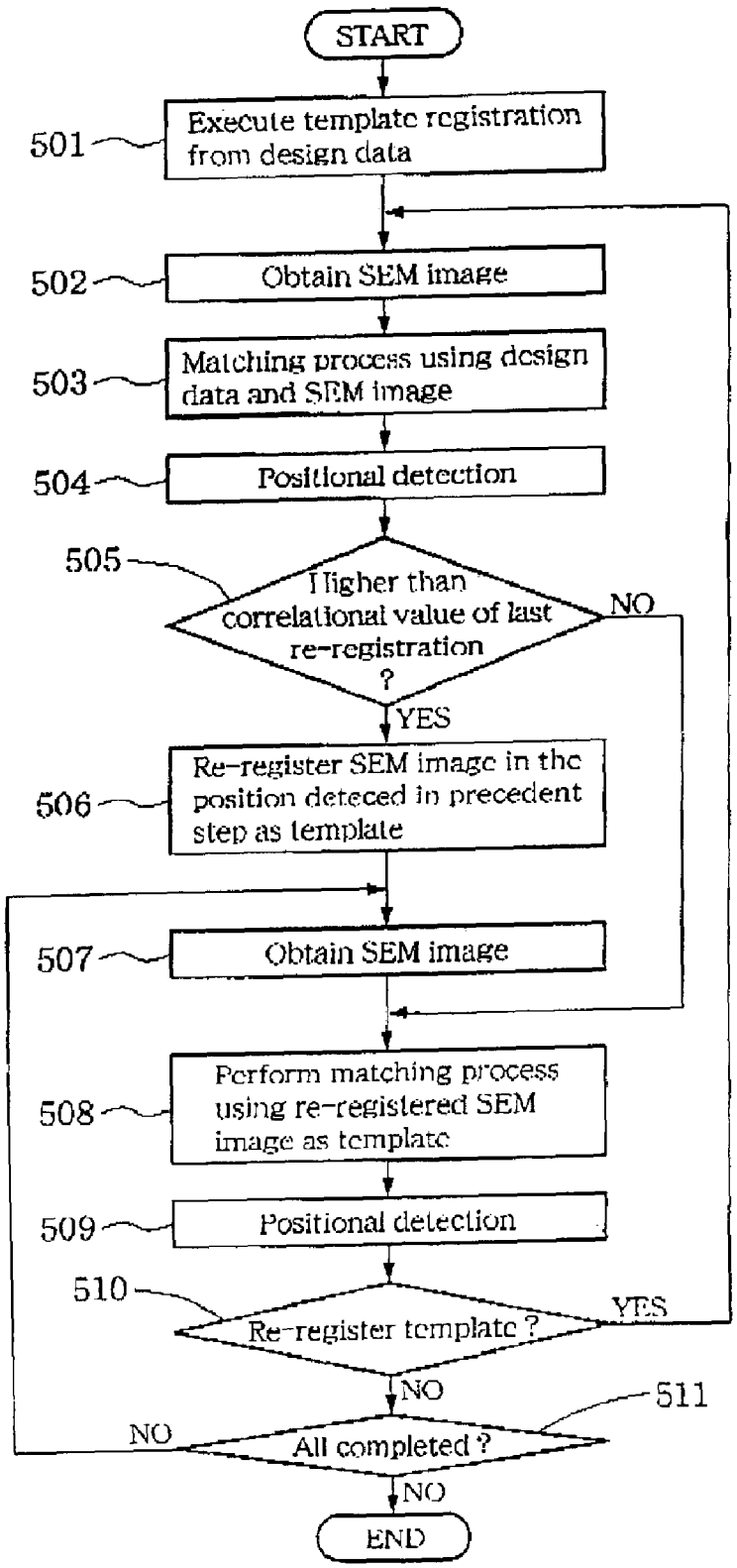
FIG. 5 is a flowchart of a re-registration process of a SEM image as a template according to the embodiment of the present invention, in the case that a correlation value is higher than the previous value.

FIG. 5 is a flowchart of a re-registration process of the SEM image as the template according to the embodiment of the present invention, in the case that the correlation value higher than the previous value is obtained. Steps 501 to 504 and Steps 506 to 510 correspond to Steps 401 to 404 and Steps 405 to 409 of FIG. 4, respectively. In Step 510, judgment is made as to whether or not re-registration of the template is carried out in every certain time interval or in every certain process frequency. When re-registration is carried out, Steps 502 to 504 are executed for performing the matching process again by use of the design data and the SEM image. Next in Step 505, if the correlation value detected in the position at this time is higher than the correlation value of the currently effective template, re-registration of the template is performed in Step 506. However, if the detected correlation value is smaller than the correlation value of the currently effective template, re-registration does not take place and the process proceeds to subsequent Steps starting from Step 507. Accordingly, it is possible to optimize the template for use as the template having the highest correlation value.

Figure 6:
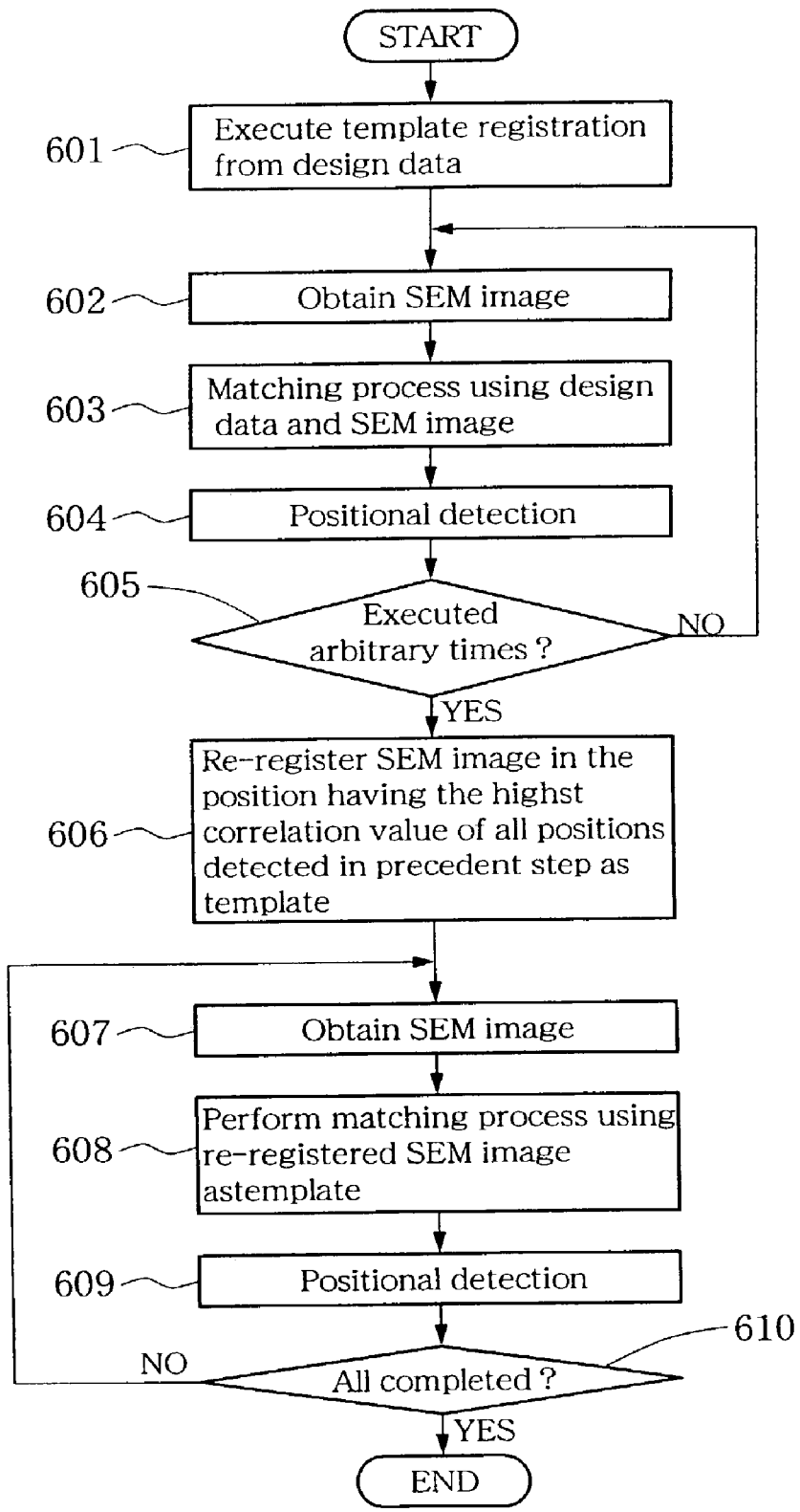
FIG. 6 is a flowchart of a re-registration process of a SEM image as a template according to the embodiment of the present invention, in which the SEM image having the highest correlation value during an arbitrary frequency of the matching processes between the design data and the SEM images is re-registered.
Figure 7:
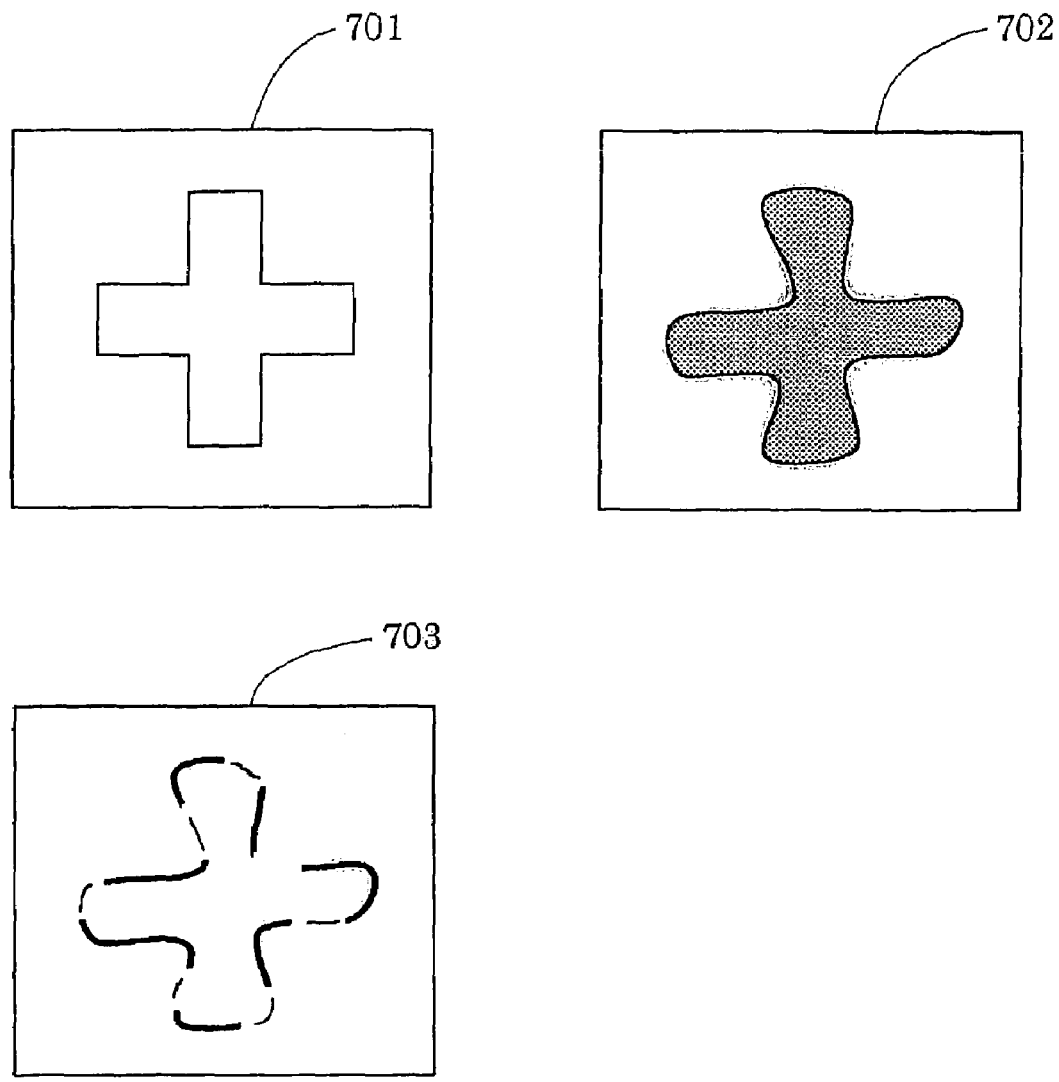
FIG. 7 shows image examples used in a conventional process.

FIG. 6 is a flowchart of a re-registration process of the SEM image as the template according to the embodiment of the present invention, in the case which the matching processes between the design data and the SEM image are performed in an arbitrary frequency, whereby the SEM image in the position highest in the correlation value among all the correlation values of the SEM images is re-registered as the template. Steps 601 to 604 and Steps 606 to 610 correspond to Steps 201 to 204 and Steps 205 to 209 in FIG. 2, respectively. The matching processes using the design data and the SEM image are iterated by an arbitrary frequency from Step 602 to Step 605, and then in Step 606, the SEM image in the position highest in the correlation value among all the detected positions is re-registered as the template. Accordingly, it is possible to select the SEM image high in the correlation value. When detection is performed a plurality of times, Steps 607 to 609 will be iterated by use of the template. Note that both processes shown in FIG. 4 and in FIG. 6 can be automated by computer programs.

Figure 8:
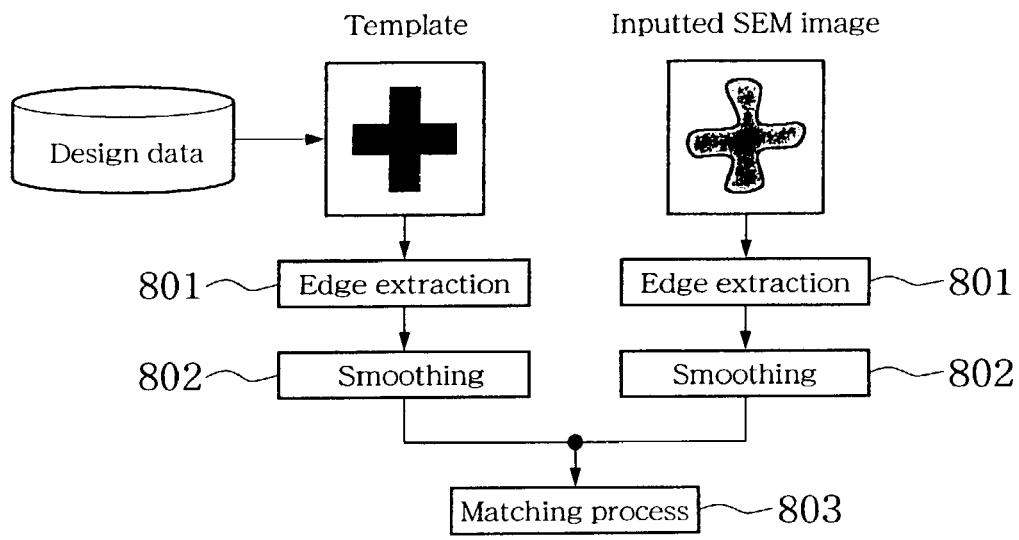
FIG. 8 is a flowchart of a matching process by use of a template of bitmap data and a SEM image according to the embodiment of the present invention.

FIG. 8 is a flowchart of the matching process according to the embodiment of the present invention by use of a template of bitmap data and the SEM image. In Step 801, edge information is severally extracted out of the bitmap data and out of the SEM image. In this part of the process, an edge emphasis filter such as a Sobel filter is generally used. In this part, both images lose contrast information and matching is thereby facilitated. However, since the SEM image has quite a different shape from the actual CAD data, the detection ratio upon matching will be reduced if nothing is done. Therefore, in Step 802, each of both images converted into edge images is severally subjected to a smoothing process to make up deformation thereof. A slightly stronger smoothing filter is applied this part of the process. In addition, smoothing strength should be varied according to the CAD data or the SEM image; specifically, smoothing of the CAD data should be carried out more strongly. Since the pair of edge images, of which deformed parts are corrected, are subjected to the matching process in Step 803, it is possible to perform the matching process with a high detection ratio. Note that the matching process can be automated by a computer program if the edge information is preset severally by the bitmap data and the SEM image to be initially extracted.

Figure 9:
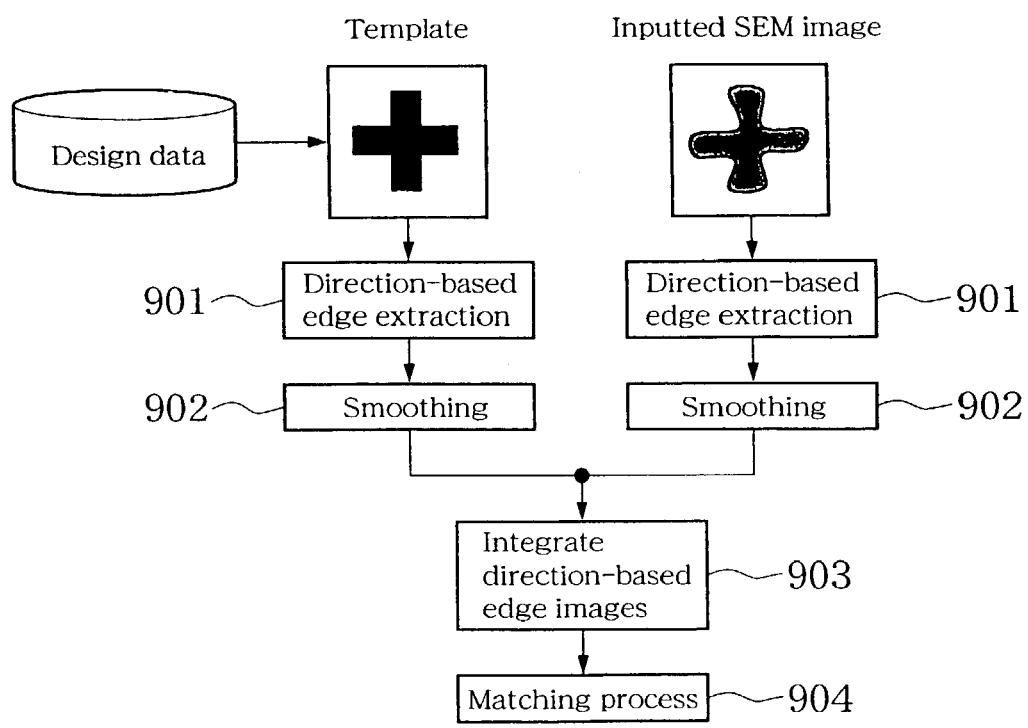
FIG. 9 is a flowchart of a matching process by use of a template of bitmap data and a SEM image according to another embodiment of the present invention.
Figure 10:
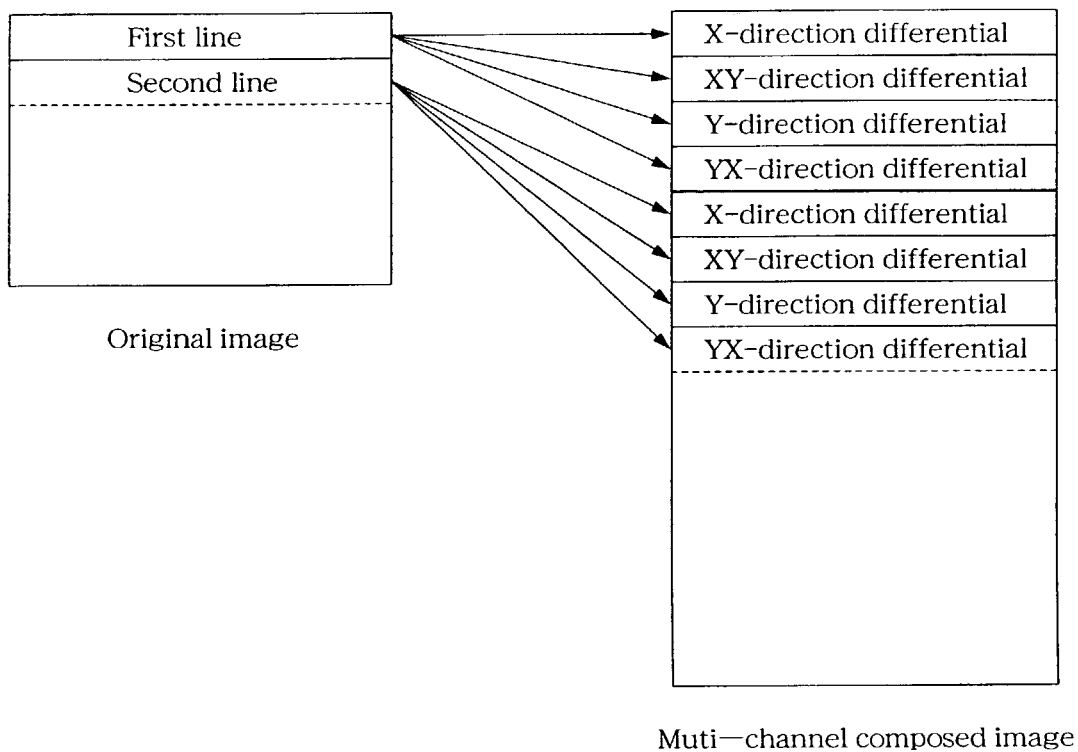
FIG. 10 shows a method of composition and integration of an image decomposed into directions.

FIG. 9 is a flowchart of the matching process according to another embodiment of the present invention by use of the template of bitmap data and the SEM image. A difference from the process flow of FIG. 8 is that edge extraction is performed in multiple directions in Step 901. As for edge extraction process in multiple directions, generally used is a Sobel filter which is capable of extracting edges in multiple directions. As for the directions, either 2 directions of X and Y, or 4 directions of X, Y, XY and YX is used. In Step 902, a smoothing process is performed on each edge image decomposed in each direction in order to make up a deformed part thereof. In Step 903, images decomposed in the respective directions are composed and integrated as illustrated in FIG. 10. In Step 904, the matching process can be performed between a pair of plain images owing to the above composition process. Needless to say, the matching process may be also performed severally with respect to each pair in the corresponding direction without performing the integration in Step 903. By extracting the edges and subjecting to the matching process with respect to each direction, matching accuracy in each direction can be enhanced. Note that an original image in FIG. 10 corresponds to a template and to an inputted SEM image in FIG. 9. Accordingly, upon finding differentials of these images in the X direction, such differentiation is carried out by dividing the original images into a plurality of lines along the Y direction. On the contrary, upon finding differentials in the Y direction, such differentiation is carried out by dividing the original images into a plurality of lines along the X direction. This matching process can be also automated by a computer program.

Figure 11:
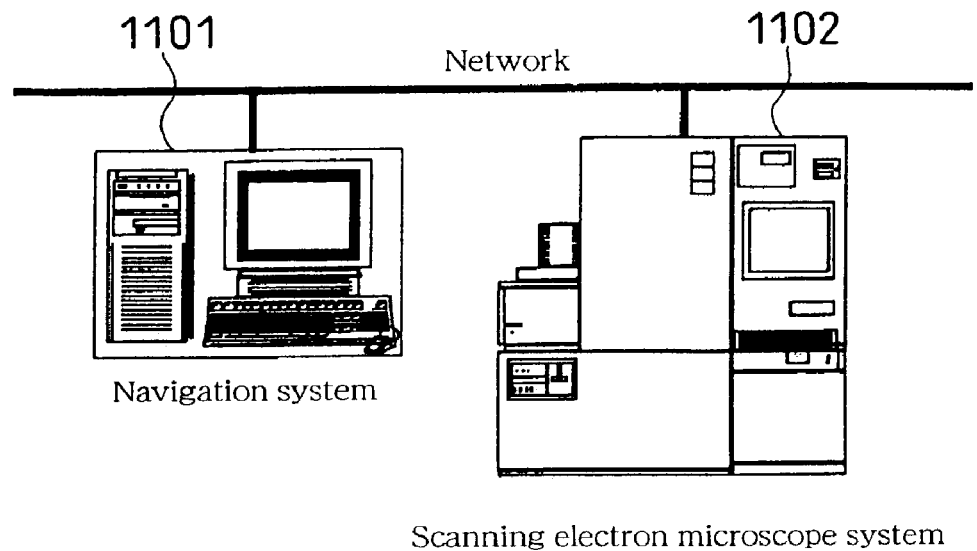
FIG. 11 is a view of a configuration of a semiconductor inspection system according to the embodiment of the present invention.

FIG. 11 is a view of a configuration of a semiconductor inspection system according to the embodiment of the present invention. Reference numeral 1101 denotes a navigation system, which is capable of storing design information of a semiconductor chip such as CAD data, and arbitrarily retrieving regions for inspection out of the design information. Reference numeral 1102 denotes the scanning electron microscope system for actually performing image capturing of a semiconductor wafer by using the information, and for executing given inspection. These systems 1101 and 1102 are linked together with a network, thus having a configuration to effectuate exchanges of information and data.

Figure 12:
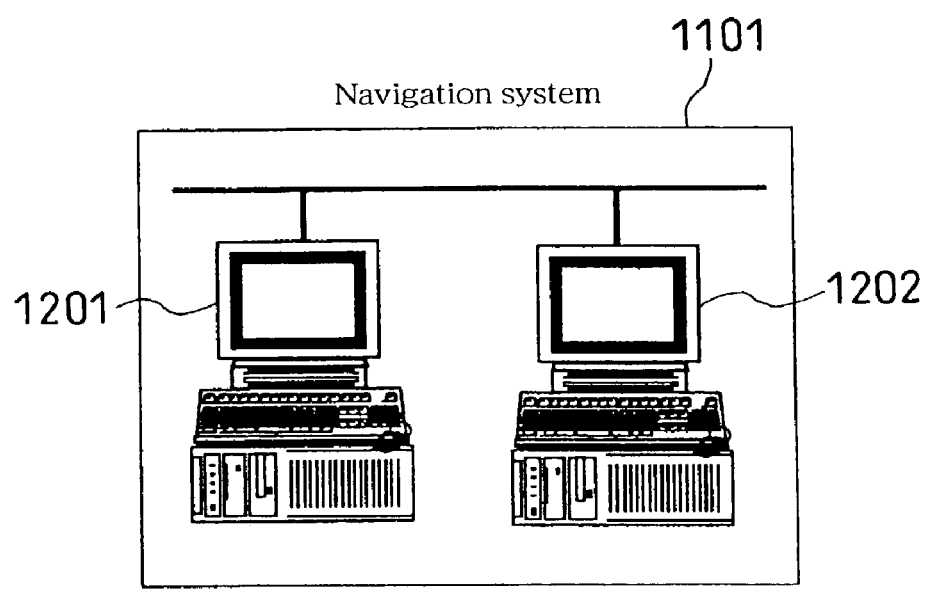
FIG. 12 is a view of a configuration of a navigation system according to the embodiment of the present invention.

FIG. 12 is a view of a configuration of the navigation system according to the embodiment of the present invention. The navigation system 1101 is composed of a bitmap data generator 1201 having functions to retrieve desired design data out of the stored design information and to generate bitmap data therefrom, and a capturing and inspecting condition editor 1202 having a function to edit and transmit capturing and inspecting conditions out of the design data for use in the scanning electron microscope system 1102. In the meantime, the navigation system 1101 may be composed in a manner that functional parts of the bitmap data generator 1201 and the capturing/editing condition editor 1202 are separately configured within one workstation (a WS) or one personal computer (a PC), or in a manner that the functional parts thereof are separately configured in two or a plurality of WSs or PCs.

Figure 13:
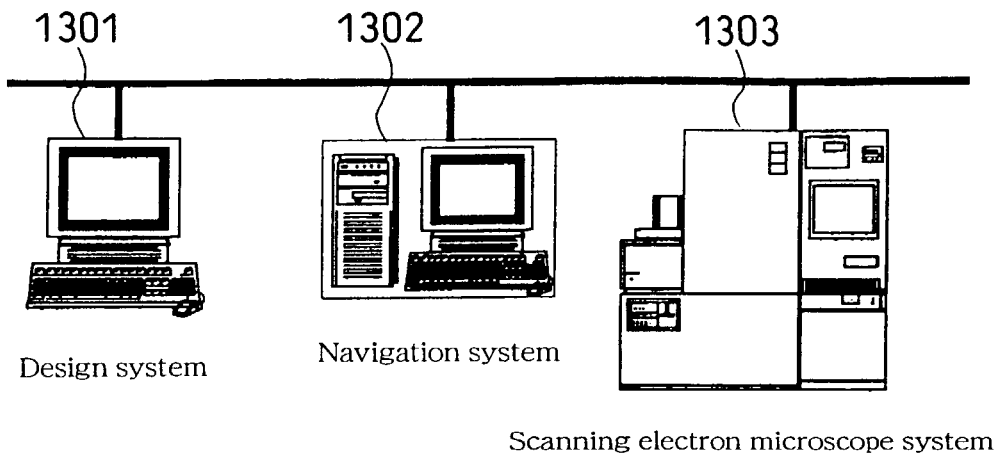
FIG. 13 is a view of a configuration of the semiconductor inspection system according to another embodiment of the present invention.

FIG. 13 is a view of a configuration of the semiconductor inspection system according to another embodiment of the present invention. A navigation system 1302 possesses a designing function of semiconductor patterns by itself. If the navigation system 1302 does not possess the designing function, the navigation system 1302 retrieves the design information from another system 1301 having the designing function, which is connected via the network, and uses the information.

Figure 14:
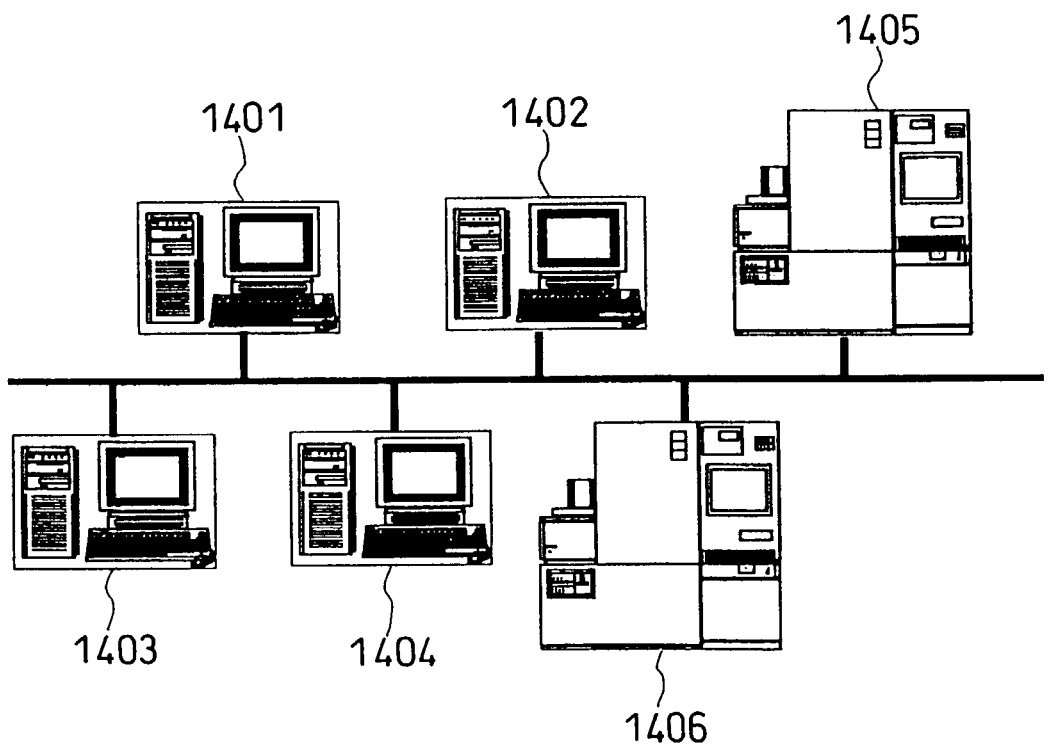
FIG. 14 is a view of a network configuration of the semiconductor inspection system according to the embodiment of the present invention.

FIG. 14 is a view of a network configuration of the semiconductor inspection system according to the embodiment of the present invention. In the semiconductor inspection system of the present invention, a navigation system 1401 can transmit and receive data with other navigation systems 1402 to 1404 connected to a network of a facility installed. The navigation system 1401 can further transmit the capturing and inspecting conditions to a plurality of scanning electron microscope systems 1405 and 1406 connected to the network. In this way, it is possible to share the capturing and inspecting conditions within the network, and it is also possible to drive a plurality of systems automatically and simultaneously.

Figure 15:
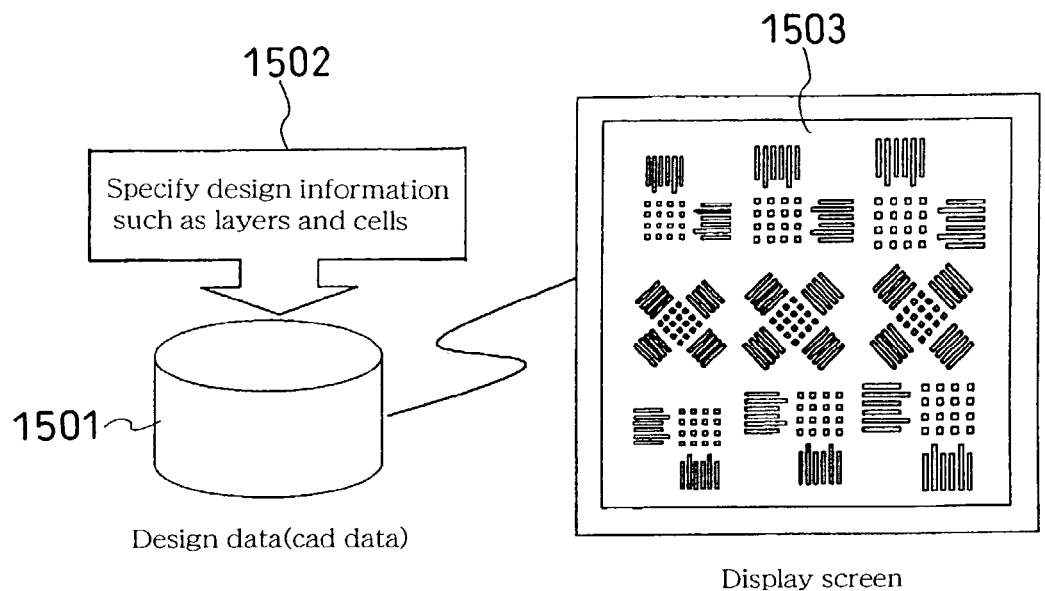
FIG. 15 is a display example in the navigation system according to the embodiment of the present invention.

FIG. 15 is a display example in the navigation system according to the embodiment of the present invention. Design data 1501 of a semiconductor is stored in the navigation system, and the navigation system has a function to allow an operator to retrieve a specified portion 1502 out of the design data 1501 by specifically inputting the design information such as layers and cells with respect to the specified portion 1502 in order to display the specified portion 1502 on a display screen as shown in reference numeral 1503. In this case, the design data 1501 may be stored in another design system connected via the network as shown in FIG. 13.

Figure 16:
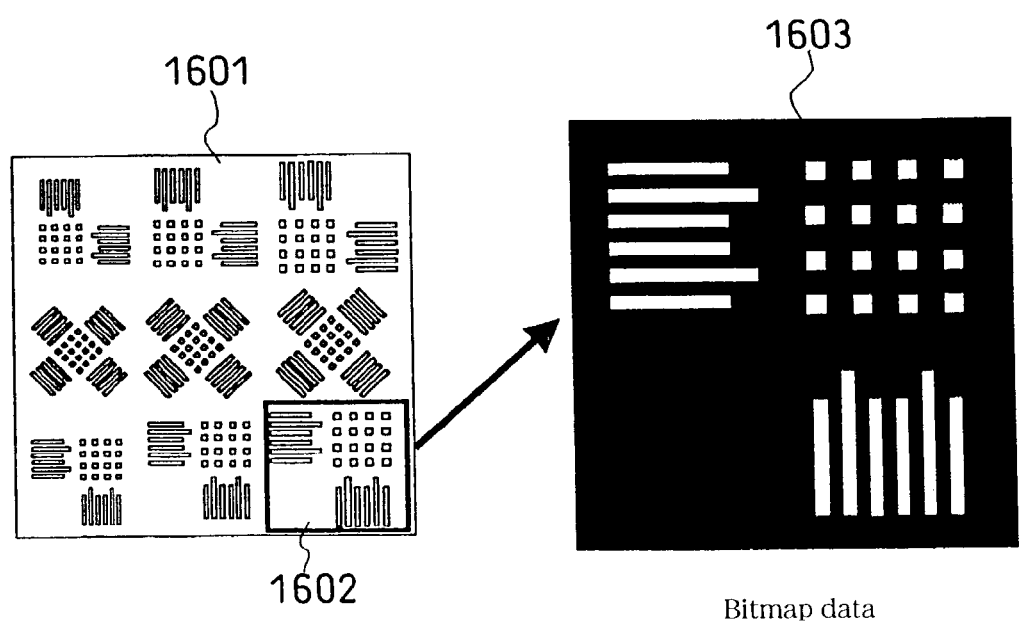
FIG. 16 is an example of bitmap data generated by the navigation system according to the embodiment of the present invention.

FIG. 16 is an example of the bitmap data generated by the navigation system 1302 according to the embodiment of the present invention. Reference numeral 1601 denotes a region retrieved from the design data in FIG. 15. Within this region, a portion 1602 subject to inspection and length measurement is specified. In this case, such an inspection/length-measurement specified region 1602 is converted into bitmap data 1603 and then transmitted to the scanning electron microscope system 1303. Here, the bitmap data 1603 consists of two values of black and white. However, such colors may be set up arbitrarily.

Figure 17:
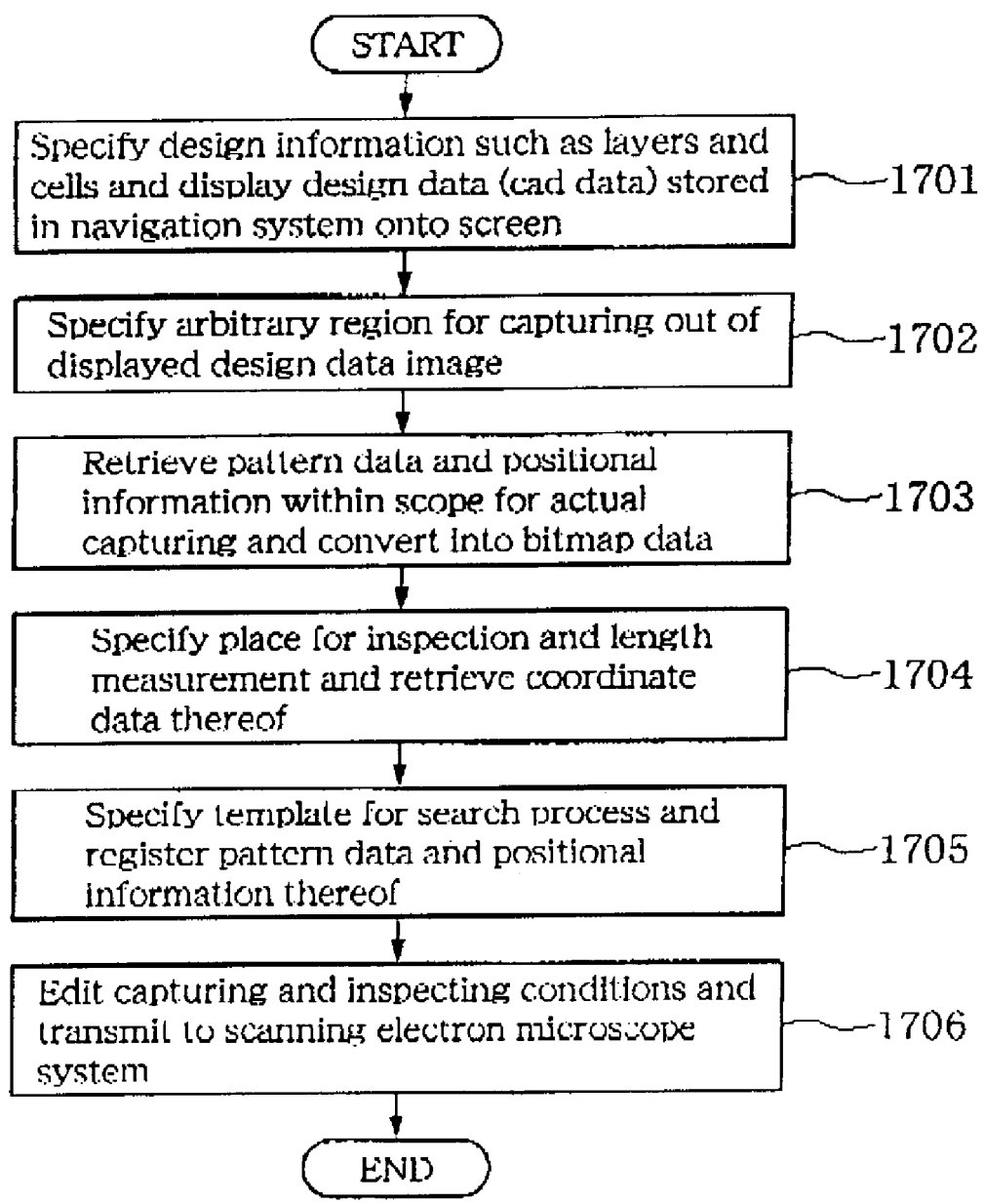
FIG. 17 is a flowchart of a process performed by the navigation system according to the embodiment of the present invention.

FIG. 17 is a flowchart of a process performed by the navigation system according to the embodiment of the present invention. In Step 1701, layer and cell information of the design or the like is specified as shown in FIG. 15, whereby the data specified out of the stored design data are displayed on the screen. A region for capturing is specified in Step 1702. In Step 1703, pattern data and positional information within a scope (the region specified as the region for capturing) are retrieved and then converted into the bitmap data 1603. This part is the same as the content as shown in FIG. 16. Next in Step 1704, a place subject to inspection and length measurement is specified and coordinate data thereof are read in. In Step 1705, specification of a template for matching is performed and registration of pattern data and positional information of the template are performed. As for specification of the template, the operator normally selects and specifies the most distinctive and characteristic portion. It is also possible to specify such a characteristic portion automatically by use of an image processing technology to detect high frequency components and distinction of an image. Lastly in Step 1706, all the information necessary for performing capturing and inspection with the scanning electron microscope system is edited based on the information gathered in Steps 1701 to 1705, and the edited information is transmitted to the scanning electron microscope system.

Figure 18:
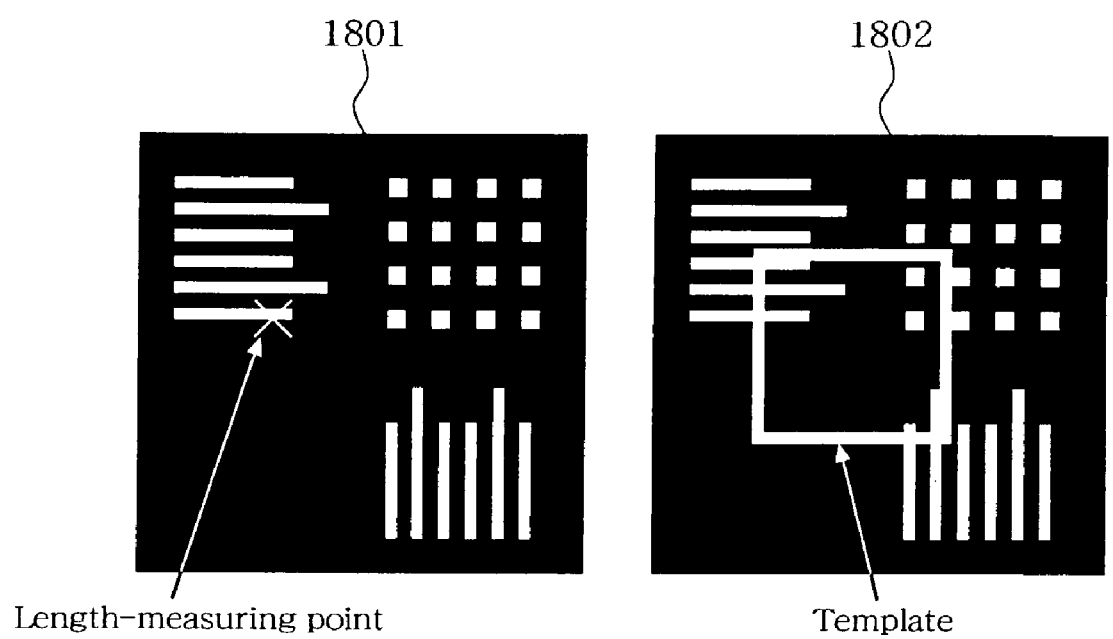
FIG. 18 shows examples of specifying a length-measuring point and a template in the navigation system according to the embodiment of the present invention.

FIG. 18 shows examples of specifying a length-measuring point and the template in the navigation system according to the embodiment of the present invention. Reference numeral 1801 denotes specification of the length-measuring point and reference numeral 1802 denotes specification of the template. Although the image subject to specification herein is set as bitmap data, it is by all means possible to specify the template on the design data prior to conversion into the bitmap data.

Figure 19:
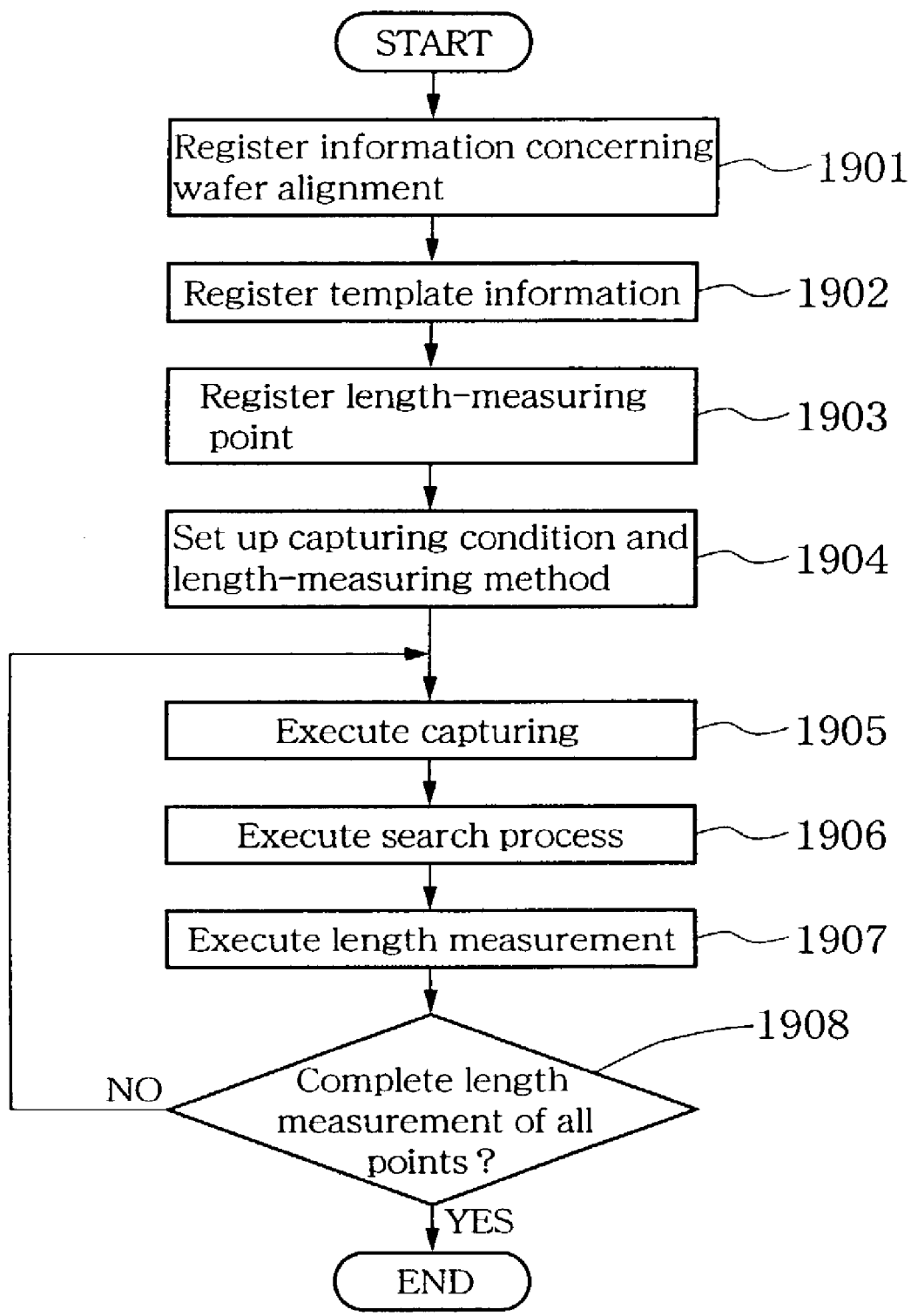
FIG. 19 is a flowchart of a process performed by a scanning electron microscope system according to the embodiment of the present invention.

FIG. 19 is a flowchart of a process performed by the scanning electron microscope system according to the embodiment of the present invention. In Steps 1901 to 1904, information concerning wafer alignment, information concerning the template for matching and information concerning the length-measuring point, conditions for capturing and a method of length measurement are registered based on the information transmitted in Step 1706 of FIG. 17. Actual capturing takes place in Step 1905. Then in Step 1906, a search process (detection of positions) is executed by use of the template registered in Step 1902. In Step 1907, the length-measuring point is computed from matching coordinates detected in Step 1906 and length measurement is executed. In Step 1908, judgment is made as to whether or not length measurement is completed with respect to all the length-measuring points. Step 1908 is provided for effectuating length measurement with respect to all the length-measuring points.

Figure 20:
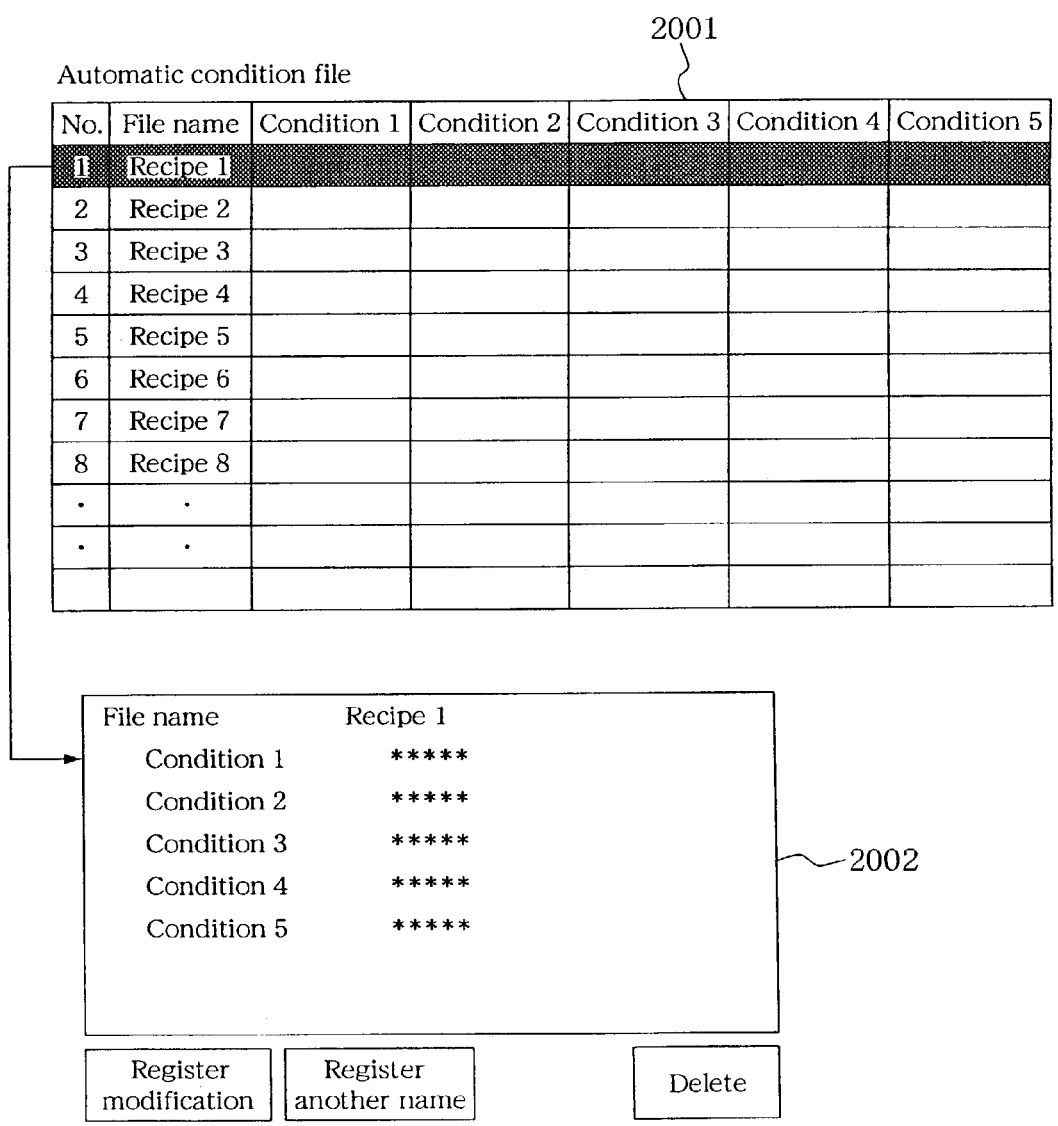
FIG. 20 shows an automatic condition file according to the embodiment of the present invention, in which capturing and inspecting conditions are registered.

FIG. 20 shows an automatic condition file according to the embodiment of the present invention, in which capturing and inspecting conditions are registered. The automatic condition file may reside either in the navigation system or in the scanning electron microscope system. Actual capturing and inspection are performed by the scanning electron microscope system in accordance with the conditions registered in the automatic condition file 2001. In the case of deciding the capturing and inspecting conditions out of the information obtained by the navigation system, if the most suitable condition is selected from recipes registered in advance as in the present invention, a process for generating the conditions can be simplified and management and maintenance thereof become convenient. Moreover, each recipe registered in the automatic condition file can be partially modified or deleted as illustrated in a table 2002. Furthermore, each recipe can be also registered in another name. In addition, it is also possible to take statistics as to how often each recipe is used in order to delete less frequently used recipes automatically.

Figure 21:
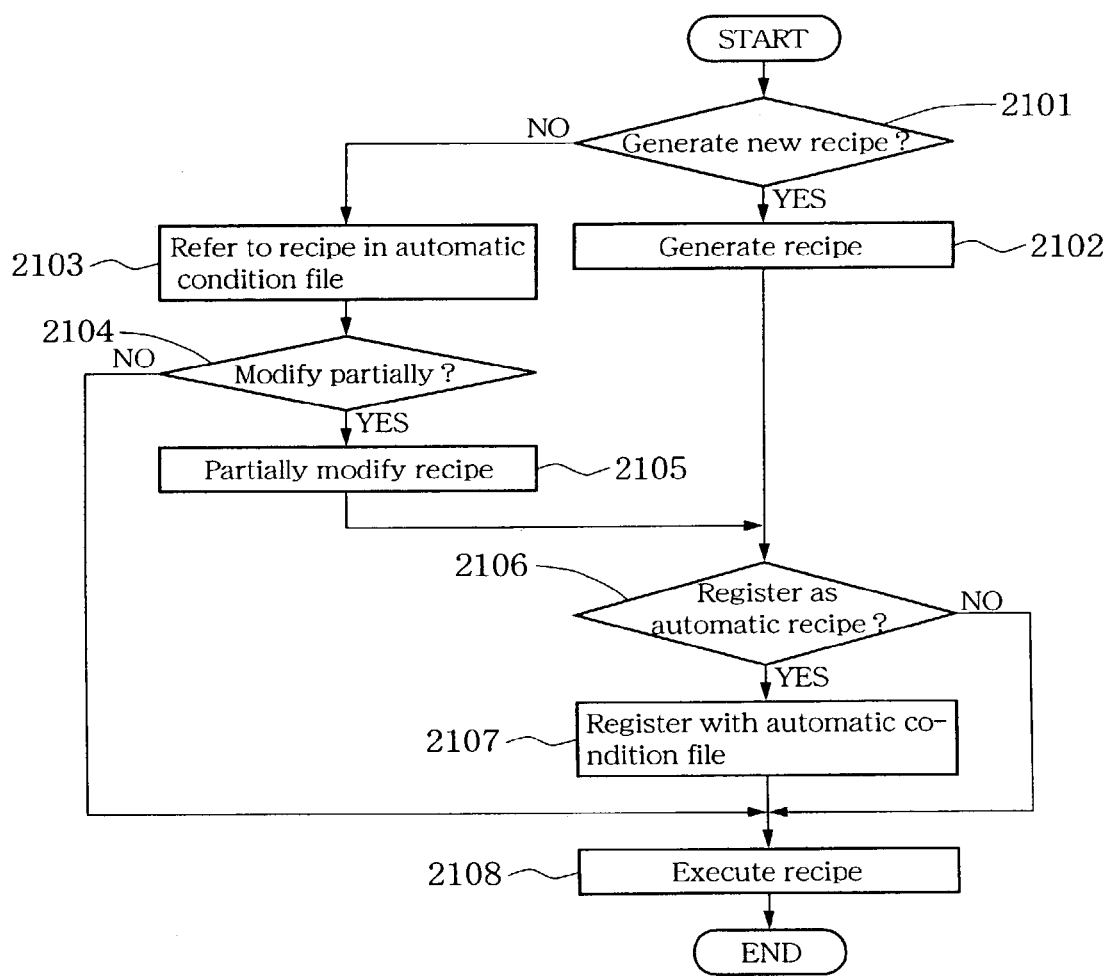
FIG. 21 is a flowchart of a process in the case of using the automatic condition film according to the embodiment of the present invention.

FIG. 21 is a flowchart of a process in the case of using the automatic condition film according to the embodiment of the present invention. In Step 2101, judgment is made as to whether a new recipe should be generated or not. If an identical or partially modifiable recipe does not exist yet in the automatic condition file 2001, the new recipe is generated in Step 2102. After generated, the new recipe is registered with the automatic condition file 2001 in Step 2106. After registration, it is possible to execute the recipe in Step 2108 with reference thereto. There may be also a case where execution only takes place without registration. In the case that the identical or partially modifiable recipe already exists in the automatic condition file 2001, the existing recipe inside the automatic condition file is referred in Step 2103, and then judgment is made as to whether the recipe should be partially modified or not in Step 2104. It is unnecessary to modify the recipe partially if the recipe is identical; therefore, the existing recipe is executed directly in Step 2108. The same is applicable to a case in which the existing recipe is not identical but substitutable. When the recipe is to be partially modified, after partial modification in Step 2105, judgment is made as to whether or not the modified recipe should be registered with the automatic condition file 2001 in Step 2106. Thereafter, the modified recipe is either registered in Step 2107 then executed in Step 2108, or just executed in Step 2108 without registration. By registering the recipe once used with the automatic condition file, it is possible to refer to the condition next time. Moreover, if the capturing and inspecting condition is modified partially, it is possible to register the modified condition as another condition in Step 2106. In this case, it is possible to refer to both files before and after such modification.

As the present invention has the configuration as described above, the following effects are achieved.

In a conventional semiconductor inspection system, registration of points for image recognition, positions for length measurement and length measuring algorithms has been performed once after capturing an image of an actual wafer and by use of the image. For this reason, there has been a problem that throughput is not improved because the registrations are time-consuming and the apparatus is occupied at the time of the registrations. Moreover, there has been a problem that it is impossible to construct an operator-free and fully-automated semiconductor inspection system because the conventional system always requires an operator for judgment and registration who observes actual SEM images.

In response to these problems, the present invention is arranged to generate all conditions necessary for inspection, including, the conditions for capturing, the points for length measurement and the length-measuring algorithms, out of the design information such as the CAD data. As the present invention is designed to perform actual inspection under these conditions, an operator-free and fully automated semiconductor inspection system with high throughput can be realized.

Moreover, in the conventional case of performing the matching process between the design data and the SEM images, it has been impossible to perform a stable matching process because the correlation coefficient becomes considerably small due to inadaptability to deformed parts between the design data and the SEM images. In response to the foregoing problem, the present invention performs the matching process to make up the deformed parts by use of the edge information in multiple directions and smoothing thereof in the case that the matching process between the design data and the SEM images takes place. In addition, the present invention performs the matching process between the edge images and the templates of the design data, and performs the matching process after re-registering the part of the SEM image corresponding to the detected position as the template. Therefore, a stable matching process with a high correlation value and a high detection ratio can be achieved.

What is claimed is:

1. A method of matching an image of a pattern on a semiconductor device produced by a semiconductor inspection system and a template comprising a bit map of CAD data, the method comprising the steps of:

decomposing the edges of the pattern image;
smoothing the edge-decomposed pattern image and the template; and matching the smoothed pattern image and the template.

2. The method according to claim 1, wherein the template is smoothed more strongly than the pattern image is.

3. A method of matching an image of a pattern on a semiconductor device produced by a semiconductor inspection system and a template comprising a bit map of CAD data, the method comprising the steps of:

extracting the edges of the pattern image by breaking up the edges in a plurality of directions;
smoothing each of the images of the edges broken up in the multiple directions;
composing the smoothed edge images in the multiple directions; and
matching the composed pattern image and the template.

4. A computer program for an image processor for matching an image produced by a semiconductor inspection system and a template comprising a bit map of CAD data that is stored in advance, the computer program controlling the image processor such that the processor decomposes the edges of the image produced by the semiconductor inspection system, smoothes the edge-decomposed image and the template, and matches the smoothed image and the template.

5. An image processor controlled by the computer program of claim 4.

6. The computer program according to claim 4, wherein the image processor is controlled such that edges are extracted from the image in a plurality of directions, and the extracted edges in the multiple directions are composed prior to the matching process.

7. A semiconductor inspection system controlled by the computer program of claim 6.

* * * * *